United States Patent [19]

Schwab

[11] Patent Number: 4,466,048

[45] Date of Patent: Aug. 14, 1984

[54] ELECTRICAL SHUNTS FOR INTEGRATED CIRCUIT APPLICATIONS

[75] Inventor: Pierre P. Schwab, Ocean Springs, Miss.

[73] Assignee: B/K Patent Development Co., Inc., Los Angeles, Calif.

[21] Appl. No.: 359,240

[22] Filed: Mar. 18, 1982

Related U.S. Application Data

[62] Division of Ser. No. 199,354, Oct. 21, 1980, Pat. No. 4,356,361.

[51] Int. Cl.³ .............................................. H02B 1/00
[52] U.S. Cl. .................................. 361/331; 221/251; 221/268
[58] Field of Search ................ 200/160; 221/251, 268; 339/95; 361/331

[56] References Cited

U.S. PATENT DOCUMENTS 4,012,608  3/1977  Lockard ........................... 200/16 D
4,356,361  10/1982  Schwab ............................ 200/16 D Primary Examiner—J. R. Scott
Attorney, Agent, or Firm—Pennie & Edmonds

[57] ABSTRACT

Modular electrical switches and shunts for use in programming electric/electronic equipment are disclosed comprising an electrically insulating, substantially rectangular housing, and a pair of elongated electrically conducting terminals secured to the base of the housing. Electrical switches of this invention contain an electrically conducting contact bearing disposed within the housing and adapted to be movable between a first position and a second position corresponding respectively to the "off" and "on" configurations of the electrical switch in response to the movement of a switch actuating member slidably disposed within the housing. A mounting bar and cartridge-dispenser for storing, transporting and installing and removing the above-described switches and shunts from integrated electrical circuits are also described.

5 Claims, 25 Drawing Figures

Position Assumed After Installation in Housing

Free Position

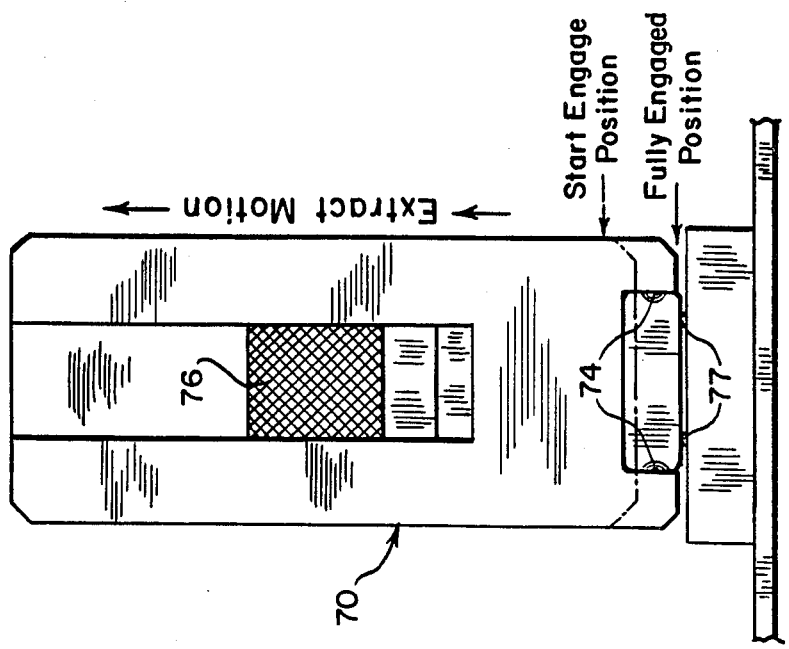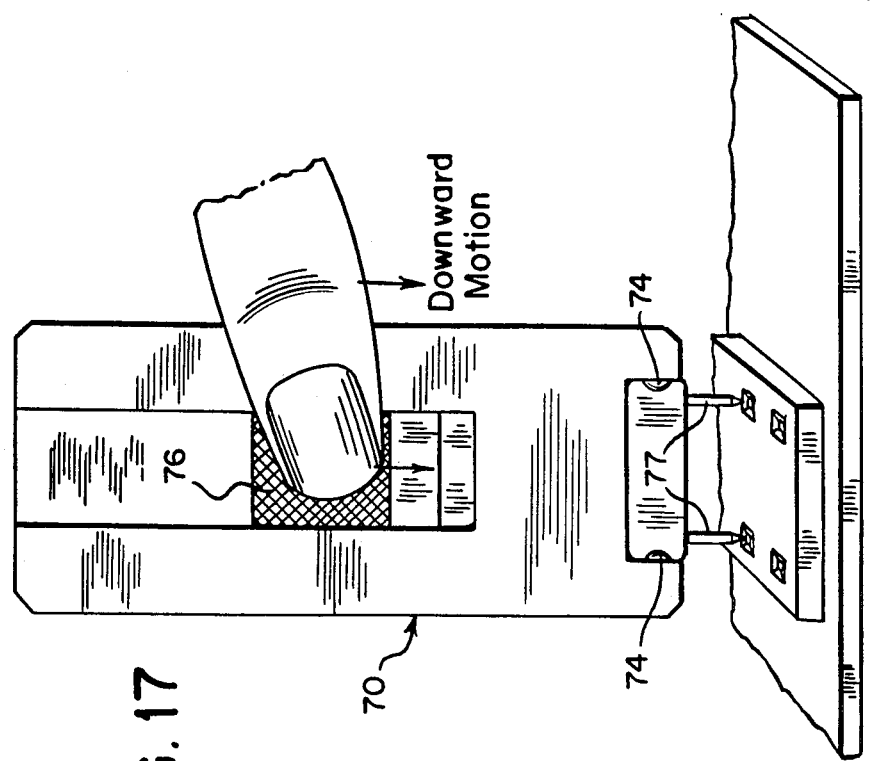

4,466,048

ELECTRICAL SHUNTS FOR INTEGRATED CIRCUIT APPLICATIONS

This is a division, of application Ser. No. 199,354, filed Oct. 21, 1980 and now U.S. Pat. No. 4,356,361, granted Oct. 26, 1982.

DESCRIPTION

1. Technical Field

This invention relates to electrical shunts and switches and devices for packaging, and installing and removing same from electrical circuits.

More particularly, the invention has to do with novel electrical shunts and switches of a modular design concept for use in conjunction with mounting bars and dispenser-cartridges, also of novel structure and design. The shunts and switches of this invention are adapted for "closing" and/or "opening" electrical circuits, e.g., on printed circuit boards or cards, in a programmable manner.

2. Background Art

The electronics industry presently utilizes certain devices called DIP-switches and DIP-shunts ("DIP" being an acronym for "dual in-line packaged") adapted to fit a specific industrial standard socket-terminal arrangement for components used in intergrated circuit applications.

DIP-switches currently in use are individually programmable switches that can be plugged into sockets mounted in a printed circuit board. The sockets (and accordingly the corespondingly configured DIP-switches) are arranged in an industry-wide standard 0.100"×0.300" grid pattern, originally developed for integrated circuit applications. The switches are usually produced and sold in solid clusters of from 2 to 10 "ganged" on-off switching elements or "stations". The terminals of each station in the cluster ae spaced 0.300-inch apart, and the adjacent terminals of adjoining stations are spaced 0.100 inch apart. Such switches are primarily used for occasional re-programming of operating modes in electronic or electromechanical equipment such as vending machines, xerographic copiers, computer-controlled machinery, and the like.

However, the aforesaid switches suffer a number of technical drawbacks which detract from their utility, particularly in commercial applications. First, presently available DIP switch elements or stations are rather complicated in their mechanical design. This adds to the cost and difficulty of manufacturing them using automated production equipment and methods, and increases their mechanical and electrical failure rate. Furthermore, conventional DIP-switches are normally of a design which lacks adequate safeguards against accidental activation. These drawbacks are further aggravated by the fact that DIP-switch elements are relatively small compared to conventional switching devices, thus requiring proportionately greater care in the precision manufacturing process and during field use. A corollary of the foregoing is that when a given switching station in a solid cluster of stations fails or is defective, the entire cluster unit, including non-defective and operative switching elements, must be segregated from the shipment or extracted from the circuit and either returned to the manufacturer for repair or discarded or scrapped. These factors likewise contribute substantially to the cost, both of manufacturing DIP-switches and of maintaining electronic/electromechanical equipment in which such units are installed. For example, conventional DIP-switches normally contain metal contact springs, usually of the cantilever type. Due to the shortness of the cantilever imposed by the standard 0.300-inch distance between DIP-switch terminals on a given station, such contact springs are subject to excessively high stresses, which can cause them to fracture. Also, metallic compression coil springs, such as those found on some conventional DIP-switches, are subject to similar stresses which can likewise lead to mechanical failure of the component.

Another type of device used in modern circuit design is the so-called programming "jumper plug" or DIP-shunt. These are designed in U.S. Pat. No. 4,030,793 and are particularly useful in situations where the reprogramming of printed circuit boards is normally done only occasionally by field technicians on electronic or electromechanical equipment such as that previously described. The use of DIP-shunts to perform this function accomplishes the same purpose at a fraction of the cost of having DIP-switches installed on the equipment. However, conventional DIP-shunts suffer the disadvantage of having a metal jumper or shunt which is exposed to the environment, thereby increasing the risk of short-circuiting during field service, unless the exposed electrically conducting part of the jumper is covered with a suitable insulating material.

Conventional DIP-switch and DIP-shunt designs as well as prior electrical switching and jumper plug technologies are exemplified in U.S. Pat. Nos. 2,246,373; 2,464,184; 2,521,468; 3,403,236; 3,618,409; 3,621,157; 3,643,042; 3,710,057; 3,750,085; 3,757,060; 3,760,486; 3,772,486; 3,792,210; 3,825,876; 3,846,900; 3,878,344; 3,958,090; 3,971,905; 4,012,608; 4,030,793; 4,061,495; 4,100,670; and 4,172,317.

A need has therefore existed for DIP-switches and DIP-shunts of simpler mechanical design and greater durability in the field than those heretofore available, and for means which permit greater versatility in storing, transporting, installation, and removal of such switches and shunts.

Accordingly, it is an object of this invention to provide a structurally and mechanically reliable, readily packageable, and low cost DIP-switch of a novel modular design concept for use in selectively closing and/or opening electrical circuits such as on printed circuit boards and in integrated circuits, in a programmable manner.

Another object is to provide a structurally and mechanically reliable, readily packageable, and low cost DIP-shunt of a novel modular design concept for use in electrical circuits such as on printed circuit boards and in integrated circuits, in a programmable manner.

Another object is to provide "on-off" switches and shunts compatible with standard integrated circuit technology, said switches and shunts being modular in construction and adapted to being adjacently ganged whereby a plurality of switches and/or shunts form a multi-station, dual-in-line packaged terminal switch and/or shunt configuration suitable for use on printed circuit boards or cards for programming or re-programming electronic/electromechanical equipment.

Another object is to provide "on-off" switches and shunts as aforesaid which can be readily produced and assembled with automated production equipment and methods.

Another object is to provide an electrical "on-off" switch as aforesaid wherein the number of moving components is minimized.

Another object is to provide an "on-off" switch as aforesaid which is further designed to prevent or inhibit accidental actuation.

Yet another object of the invention is to provide devices for mounting and for packaging, shipping and installation and removal of the aforementioned DIP-switches and DIP-shunts.

These and other objects of the invention, as well as a fuller understanding of the utility and advantages thereof can be had by reference to the following disclosure and claims.

DISCLOSURE OF THE INVENTION

The foregoing objects are achieved according to the present invention whereby a modular, electrical on-off DIP-switch is provided for use in programming electric/electronic equipment.

As broadly disclosed herein, the electrical switch of this invention comprises an electrically insulating, substantially rectangular housing having a plurality of electrically non-conducting walls, including a base wall, a top wall having an aperture therein, and two end walls, said housing having additionally a pair of electrically non-conducting side walls bonded thereto. A pair of elongated, electrically conducting terminals are secured to and extend through the base wall of the housing and protrude outwardly therefrom in substantially mutually parallel spaced relationship. Each of the terminals has a portion located inwardly of the housing in a non-contacting, spaced relationship to the inwardly located portion of the other terminal. An electrically conducting contact bearing is disposed within the housing and is adapted to be movable between a first position in which the bearing is in contact with but one of the terminal portions located within the housing and a second position in which the bearing bridges the span between and is in simultaneous contact with both of the inwardly located terminal portions. The aforesaid first and second positions correspond respectively to the "off" (open) and "on" (closed) configurations of the electrical switch. A switch actuating member of electrically non-conducting material is slidably disposed within the housing and is engageable through the aperture in the top wall of the housing for actuating the switch. This switch-actuating member is adapted to resiliently bias the movable contact bearing in the first and second positions and permit the bearing to move in rsponse to and in cooperation with the sliding movement of the member between the first and second positions.

In one mode of this embodiment of the invention the housing has a dove-tail shaped portion extending from the outer surface of the base wall between the terminals. This is intended for loading the switch onto a mounting-bar which is grooved to a matching dove-tail shaped configuration to receive the dove-tail shaped portion of the housing. In addition or alternatively, the outer surfaces of the end walls of the housing can each have a horizontal groove and a vertical groove for respectively loading the switch onto and dispensing the switch from a dispenser-cartridge. The top wall of the housing has a pair of spaced-apart recesses partially filled with an adhesively resilient cushion material, said recesses being located in alignment with the axes of the electrically conducting terminals protruding from the base wall of the housing and adapted to receive and retain the terminals of a second electrical on-off switch with sufficient adhesion to allow stacking of a plurality of electrical switches.

It is a feature of the electrical switches of this invention that the switch-actuating member comprises a switch actuating button portion protruding through and slidably mounted within the opening in the top wall of the housing, a contact bearing pressure spring portion in the form of a resilient cantilever depending from the button portion, and a contact bearing carrier portion in the form of a cavity located near the terminus of the cantilever and disposed to receive therein the contact bearing and to bias said bearing in the first and second positions and retain the bearing during movement between said first and second positions.

In another embodiment, the invention is a modular electrical shunt for use in programming electric/electronic equipment, which comprises an electrically insulating, substantially rectangular housing block including a base, a top, and two end walls. A pair of elongated, electrically conducting terminals are secured to and extend outwardly from the base of the housing block in substantially mutually parallel spaced relationship. The housing of the shunt has a dove-tail shaped portion extending from the outer surface of the base wall between the electrically conducting terminals. This dove-tail shaped portion is adapted for loading the switch onto a mounting bar having a groove correspondingly shaped to receive said dove-tail shaped portion. The outer surface of the two end walls each has a horizontal groove and a vertical groove for respectively loading the shunt onto and dispensing the shunt from a dispenser cartridge. The top surface of the housing has a pair of spaced-apart recesses partially filled with an adhesively resilient cushion material, said recesses being located in alignment with the axes of the electrically conducting terminals extending outwardly from the base of the housing block. The purpose of these recesses is to receive and retain the terminals of a second electrical shunt with sufficient adhesion to allow stacking of a plurality of shunts.

It is a further feature of this invention that the present single DIP-shunt modules and the herein described mounting-bar into which such modules can be loaded in any sequence permits the preparation of DIP-shunt programs in advance. Thus, when a particular program on a piece of equipment is to be changed, the old program is simply removed and the new one installed. This eliminates any possibility of human error when re-programming is accomplished by actuating DIP-switches. Furthermore the removed old program can be re-used and modified indefinitely to make new programs. Another advantage of the DIP-shunt modular concept is that only live and dummy DIP-shunts need to be carried in inventory instead of (8) or more different DIP-switch assemblies. Yet another advantage of the modular DIP-shunt concept is that the DIP-shunt may also be used without mounting it to the mounting-bar and can be directly inserted into any DIP-socket manually or by using the herein described cartridge-dispenser. The cartridge-dispenser basically consists of a flat, elongated housing having a longitudinal recess the full length thereof; a pair two elongated cavities at either end of the housing and flanking the recess, each cavity containing a tension spring and a ball or roller at ech end; a cover; and a slidable button essentially rectangualar in shape, captive between said cover and the housing.

The dispenser-cartridge according to the present invention is primarily intended for use in dispensing, i.e., inserting and extracting or removing the herein described DIP-switches and shunts while at the same time serving as a cartridge for storing or transporting a multiplicity of shunts or switches, e.g., in the shirt pocket of a field technician who would employ the device in programming or reprogramming electrical/electronic equipment.

The foregoing description of the present dispenser-cartridge is by no means intended to suggest that its use is limited to manual applications. On the contrary, while the dispenser-cartridge of this invention would typically contain 15 to 20 modular units, the invention is readily applicable to mass-production equipment and techniques for automatically dispensing modular DIP-switches and DIP-shunts, as will be readily apparent to those skilled in the art and having the benefit of the present disclosure before them.

BRIEF DESCRIPTION OF THE DRAWINGS

Further details of the present invention including the nature, advantages, and various additional features thereof, and its preferred embodiments can be had by reference to the accompanying drawings, wherein:

FIG. 17 is a perspective view of the cartridge-dispenser of FIG. 15 being used for inserting shunt modules into a socket unit; and FIG. 18 is a plan view of the cartridge-dispenser of FIG. 15 being used for extracting a shunt module from a socket arrangement.

BEST MODE FOR CARRYING OUT THE INVENTION

Figure 1A:
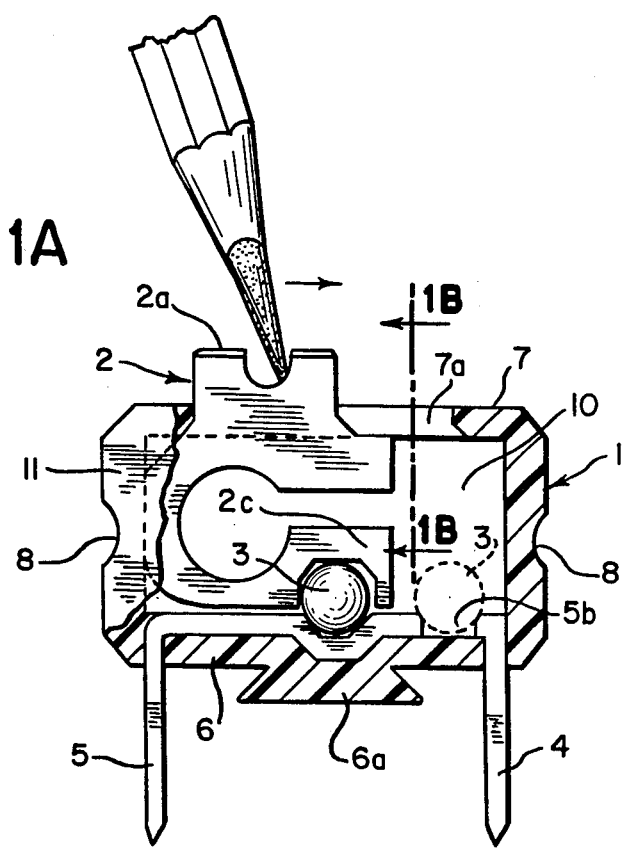
FIG. 1A is a front elevational view, in partial cross-section, of a first embodiment of the "on-off" switching module according to the present invention.

In the following description, the same structural elements shown in the accompanying drawings are designated by the same reference numerals. Letter suffixes are added to denote specific ones of those elements where necessary.

FIRST EMBODIMENT

Figure 1B:
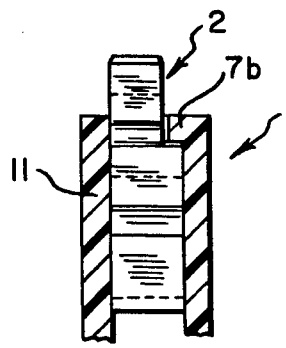
FIG. 1B is a side elevational view, in partial cross-section, taken along line 1B—1B of FIG. 1A.
Figure 1C:
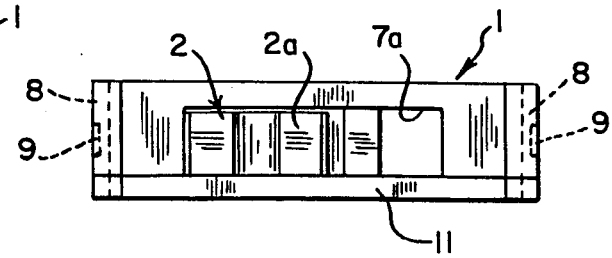
FIG. 1C is a top plan view of the switching module embodiment shown in FIG. 1A.
Figure 2:
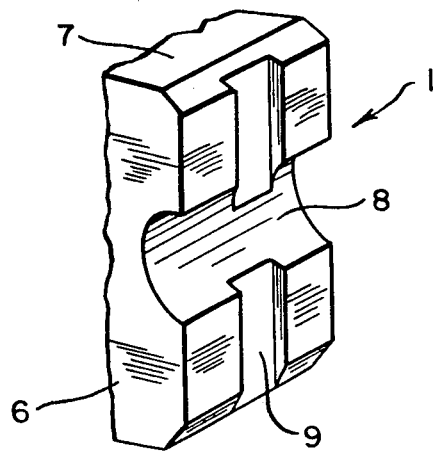
FIG. 2 is a partial elevational view in perspective of the embodiment shown in FIG. 1A.
Figure 3:
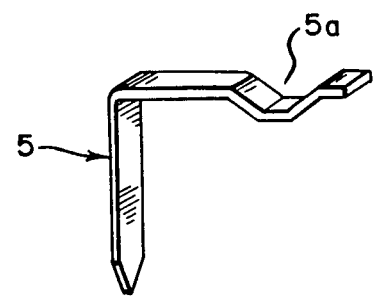
FIG. 3 is a perspective view of one of the electrical terminals of the embodiment shown in FIG. 1A.
Figure 4:
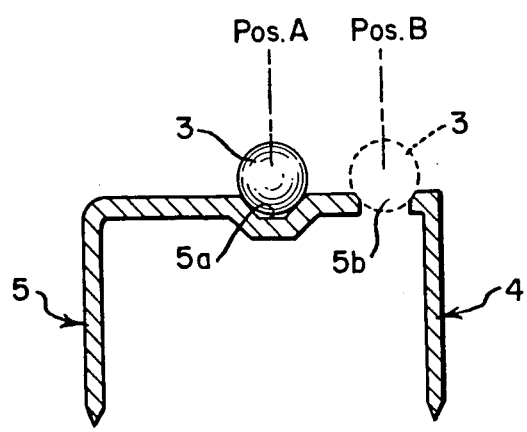
FIG. 4 is a cross-sectional view of the electrical terminals of the embodiment shown in FIG. 1A, in the "on" and "off" switching modes.
Figure 5A:
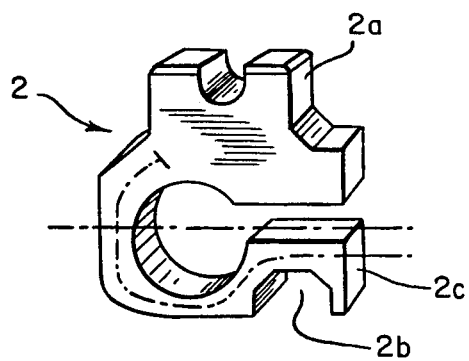
FIG. 5A is a perspective view of the pressure spring component as incorporated into the embodiment shown in FIG. 1A.

Referring to FIG. 1A, a housing 1 of essentially rectangular cross-section has a dove-tail shaped portion 6a protruding from base 6, an opening 7a in the opposite or top wall 7, and, as shown more clearly in FIG. 2, a semi-circular horizontal channel, groove or notch 8 and a vertical rectangular channel, groove or notch 9 on the left and right ends of the housing. Within the rectangular cavity or recess 10 of housing 1 is a slidable member 2 which functions simultaneously as the switch-actuating button, carrier for contact bearing 3, and contact bearing pressure spring, as will be described in detail hereinbelow. FIG. 5A depicts member 2 separate from the other components of the invention; the switch-actuating button, contact bearing carrier and pressure spring aspects of member 2 are depicted in FIG. 5A as elements 2a, 2b, and 2c, respectively. The semi-circular notch atop button portion 2a is intended to facilitate switching action by using an appropriate tool, e.g., a pencil point, as shown in FIG. 1A, to actuate the switch. An electrical terminal 5, depicted in FIGS. 1A, 3 and 4, is fixedly mounted or secured (e.g., molded) between slidable member 2 and the inner wall of base 6 within housing 1. One portion of terminal 5 extends essentially at a right angle through base 6 of housing 1. Another electrical terminal 4 is likewise fixedly mounted into base 6 of housing 1, as shown in FIG. 1, so as to leave an open gap 5b between both terminals as shown in FIGS. 1A and 4. A movable contact bearing 3, which can be, e.g., spherical or cylindrical in shape, is disposed within the essentially circular cavity formed by the contact bearing carrier portion 2b of slidable member 2 and the "V"-shaped bent portion 5a of terminal 5.

A cover 11, partially shown in FIG. 1 and having a shape and size corresponding to the peripheral outline of housing 1, is welded or otherwise bonded to the housing by means of suitable adhesive or other means useful in the industry for such purposes, e.g., high-frequency vibration. The housing 1 and cover 11 are preferably made from a suitable rigid and electrically insulating plastic material. The contact terminals 4 and 5 can be molded directly into the base of the housing 1 and are made of an electrically conductive material such as beryllium-copper alloy which can be heat-treated and hardened after bending and shaping the terminal so that the portions of the terminal protruding at right angles through base 6 of the housing (and which are therefore parallel to each other and separated by 0.300-inch in accordance with the current industry standard) will be rigid enough to resist accidental bending or spreading which would impede or prevent insertion thereof into the receptacles of the corresponding DIP-socket. The terminals 4 and 5 can be advantageously nickel-gold plated for enhanced electrical contact. Contact bearing 3 is desirably made from a relatively soft (compared to terminals 4 and 5) electrically conductive material such as brass or copper. Also, bearing 3 is advantageously electroplated with a thin nickel-gold layer to prevent oxidation, tarnishing or film-formation on the contact surface which would otherwise diminish conductance at the very low electrical currents normally encountered in DIP-switch applications.

Figure 5B:
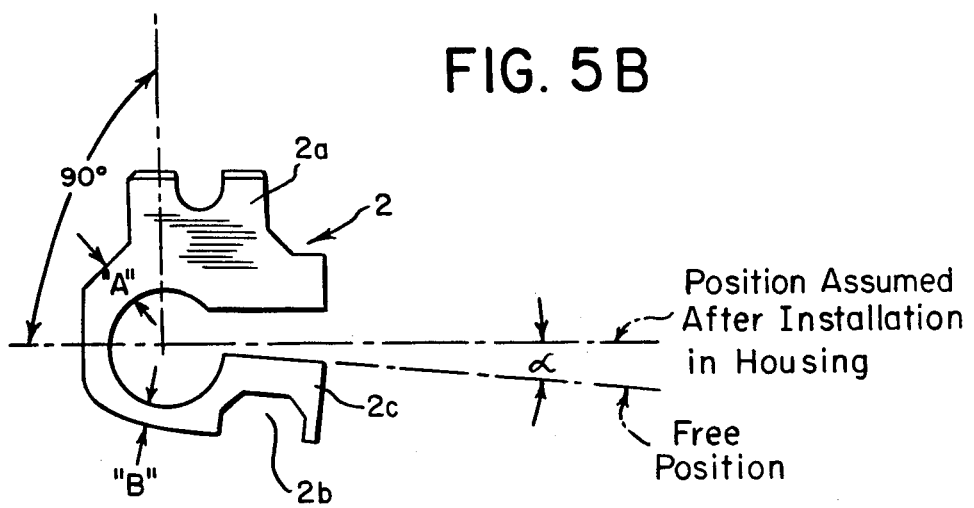
FIG. 5B is a front elevational view of the pressure spring component shown in FIG. 5A prior to assembly of the embodiment shown in FIG. 1A.

The slidable member 2 is electrically non-conductive and can be fabricated of a plastic material, e.g., a Delrin-type polyacetal, having a suitably low coefficient of friction to facilitate sliding from the "open" or "off" switch position A to the "closed" or "on" switch position B along with contact bearing 3 as shown in FIG. 4, and suitable resiliency and springback memory to provide good cantilever-spring properties along the dashed line shown in FIGS. 5A and 5B.

FIG. 5B shows slidable member 2 in its free position as molded, with its spring-arm portion 2c at an angle α, the magnitude of which determines the pressure exerted on contact bearing 3 by the spring arm portion in the assembly shown in FIG. 1A. The general shape of spring arm portion 2c is that of a novel beam-type cantilever-spring, wherein a relatively thick cross-section, "A", at the point of least spring-arm deflection diminishes gradually to a relatively thin cross-section, "B", at the point of essentially maximum arm deflection.

When slidable member 2 is in the "off" or open position shown in FIG. 1A, there can be no electric current through terminals 4 and 5 since movable contact bearing 3 will be pressed or biased firmly into the "off" or open position in the detented or "V"-shaped bent portion 5a of terminal 5 due to the pressure exerted on the contact bearing by the spring-arm portion 2c of the slideable member. In this configuration, slideable member 2 now resists right-ward (as depicted in the drawing) movement to the "on" or closed position with a force equal to all opposing forces resulting from the pressure on contact bearing 3. As member 2 is forcibly moved from left to right, the spring-arm portion of the member will deflect upward and the contact bearing 3 will roll-up the right hand portion of the "V"-shaped recess 5a of terminal 5 and come to rest by detenting abruptly into the gap 5b between terminals 4 and 5, thereby electrically connecting them and allowing the passage of electricity. Furthermore, because of the geometry of slidable member 2, and depending on the depth of "V"-shaped portion 5a of terminal 5, the force required to move the member back to its "open" positon can be made greater or less than the force required to move it into the "closed" position just described. This is a desirable safety feature inherent in the design of the present invention inasmuch as it provides a means of reducing the risk of accidental or inadvertent closing or opening of the circuit, as desired.

Figure 12A:
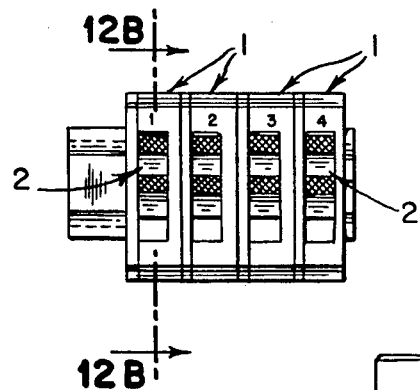
FIG. 12A is a top plan view of a fourth embodiment of the invention in which a plurality of "on-off" switching modules are in adjacently ganged or stacked relationship on a mounting-bar for storage, shipment or installation.
Figure 12B:
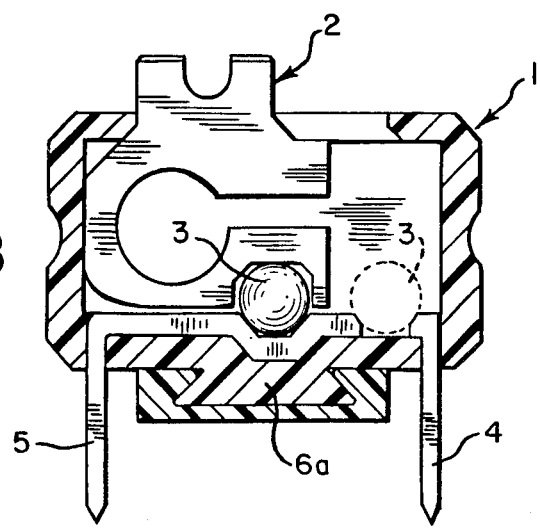
FIG. 12B is a front elevational view, in cross-section, taken long line 12B—12B of FIG. 12A.

The slidable member 2 is retained in cavity 10 of housing 1 by a raised lip portion 7b along opening 7a as shown in FIG. 1B. As indicated above, base 6 of housing 1 features a dove-tail shaped ridge 6a protruding therefrom. The dove-tail portion 6a is designed to permit loading of the switch onto a correspondingly grooved mounting bar, as shown in FIGS. 12A and 12B.

Figure 6:
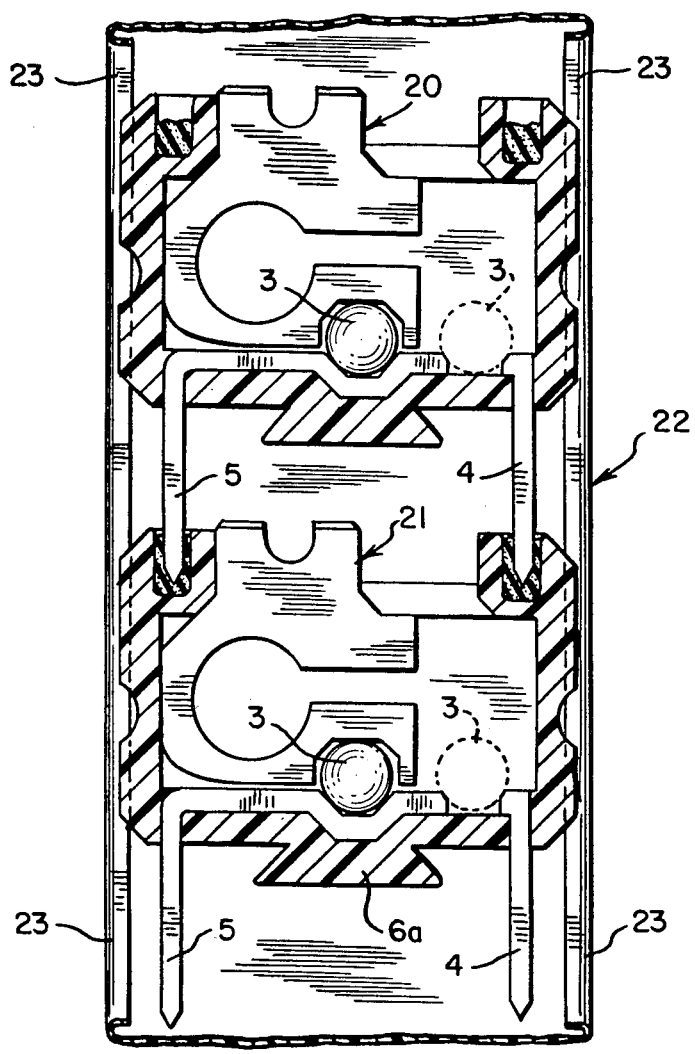
FIg. 6 is a plan view, in cross-section, of a pair of switching elements according to an embodiment of the invention showing the manner in which such elements can be vertically ganged or aligned for storage, shipment or installation.
Figure 7:
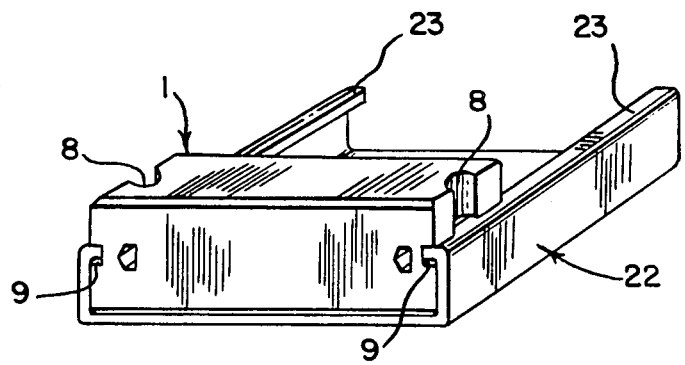
FIG. 7 is a perspective view of the embodiment shown in FIG. 6.

Referring to FIG. 2 there are shown details in the design of housing 1 which facilitates loading the switches into a carrier for storage, shipping, insertion and removal or extraction purposes as shown in FIGS. 6 and 7, or for loading into the dispenser-cartridge or magazine the same way as the DIP-shunts in the manner described hereinafter. The semi-circular notch 8 serves as a detent groove and rectangular groove 9 serves as the guide or track means, for using the switches in conjunction with the dispenser-cartridge.

FIG. 6 shows two DIP-switches 20 and 21 retained within a carrier strip portion 22 by engagement between lips 23 of the carrier strip and grooves 9 of housing 1 of the DIP-switch shown in FIG. 2. The engagement between lips 23 and grooves 9 is shown more clearly in FIG. 7. Desirably, the opening between lips 23 of carrier 22 is slightly less than the distance between the grooves 9 of the switch, thereby retaining the switch in place by the pressure bias exerted by the carrier lips. Carrier strip 22 is preferably made from a plyable strong plastic material, several of which materials are known to be capable of extrusion at very low cost, e.g., nylon, polyolefin and the like.

SECOND EMBODIMENT

Figure 8:
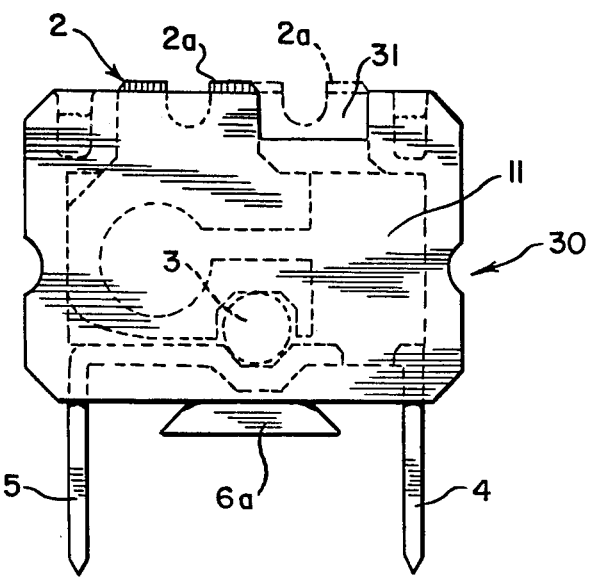
FIG. 8 is a front elevational view of a second embodiment of the "on-off" switching module of the present invention being of tamper proof construction and having a status-indicating window.

FIG. 8 shows a DIP-switch 30 similar to that of FIG 1. with the additional feature of tamper-proof construction. In the "open" or "off" position the slidable button or member 2 cannot be moved into the "closed" or "on" position without the purposeful aid of a tool such as a pen or other pointed object or implement. Another feature of this embodiment is a visual status indicating means in the form of a rectangular opening or "window" 31 in the cover 11 (see FIG. 8) and housing (see FIG. 9) essentially centered about the axis of the "on" or closed position of the switch actuating member. As shown in FIG. 8, when the slidable button or member 2a is in the closed position as shown in dotted line, the observer will perceive the colored (e.g., red) slidable button and know that this is indicating a closed condition. It is of course preferred that contrastingly colored materials be used for the housing/cover and the slidable button.

Figure 9:
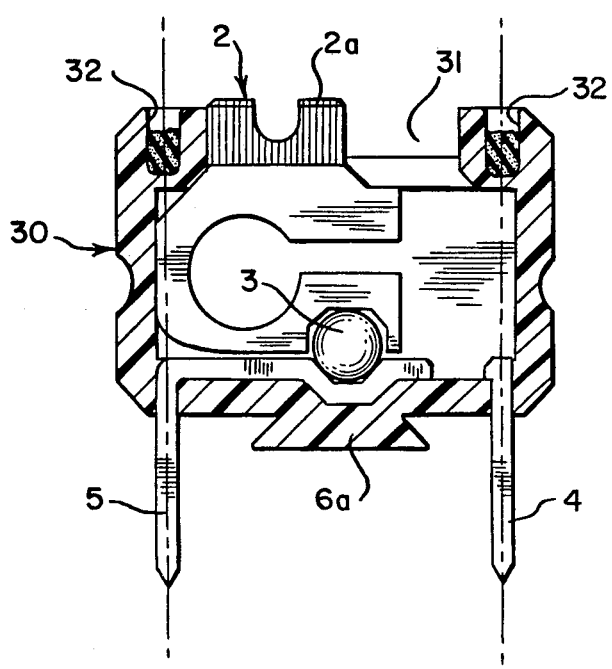
FIG. 9 is a front elevational view, in cross-section, of the switching module embodiment shown in FIG. 8.
Figure 10:
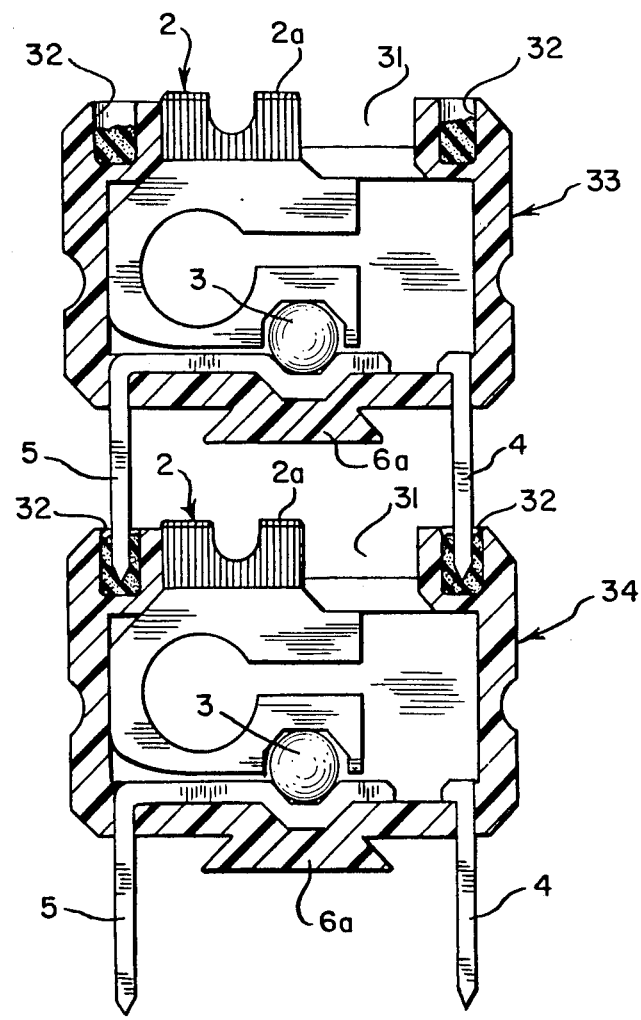
FIG. 10 is a front elevational view, in cross-section, of a plurality of "on-off" switching modules of the type shown in FIGS. 8 and 9, in vertically ganged or stacked relationship for storage and/or shipment.

Another feature of this embodiment is the provision of recesses 32 which can be partially filled with a resilient, adhesive cushion material 32a such as silicon-rubber or equivalent compound as shown in FIG. 9. The recesses 32 are spaced apart and are located in alignment with and on the same axes as the contact terminals. These recesses 32 allow vertical or "piggy-back" stacking of a plurality of DIP-switches as shown in FIG. 10, or loading into the dispenser-cartridge described herein wherein after a switch 33 has been pressed with its terminals 4 and 5 into the recesses 32 of another switch 34, so as to pierce the cushion and come to rest at the bottom of the recesses, said terminals will be retained by the resilient nature of the silicone-rubber compound with sufficient adhesive force to allow handling a stack of, for example, 15 switches and keep them together as shown in FIG. 10.

Another feature is that when the DIP-switches are stored or handled in piggy-back stacks undesirable bending of terminals is substantially prevented.

THIRD EMBODIMENT

Figure 11:
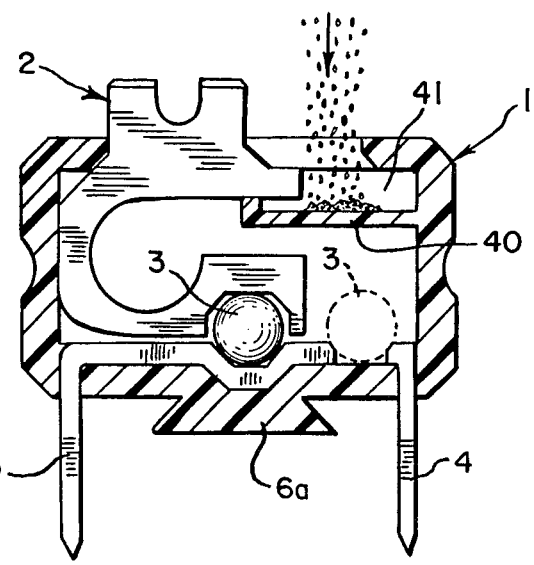
FIG. 11 is a front elevational view in cross-section, of a third embodiment of the "on-off" switching module according to the present invention having a dust-proof construction.

FIG. 11 illustrates a dust-proof DIP-switch construction wherein a dust baffle 40 is molded as an integral part of housing 1 and is designed to engage opening 41 of the slideable member 2 as shown.

This embodiment is especially desirable for use in environments in which the switch is subject to prolonged or extensive exposure to dust and other airborne particulates, which, if allowed to accumulate within the housing 1, would eventually interfere or prevent proper operation of the module.

FOURTH EMBODIMENT

A fourth embodiment of the invention is a switch mounting-bar 42 as illustrated in FIG. 12A onto which the DIP-switches 43a, 43b, 43c and 43d may be slidably mounted to form a multi-station modular DIP-switch assembly as shown. The mounting-bar 42 is made from a suitable plastic material with a low coefficient of friction and some resiliency so that the dove-tail groove 44 in the bar as shown in FIG. 12B fits closely onto the dove-tail shaped protrusion 6a on the base 6 of switch housing 1.

FIFTH EMBODIMENT

Figure 13A:
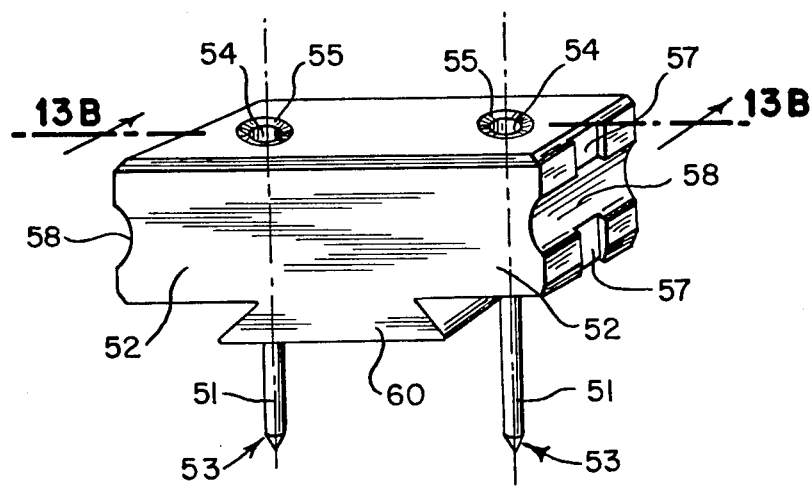
FIG. 13A is an elevational view in perspective of a fifth embodiment which is a shunt module according to the present invention.
Figure 13B:
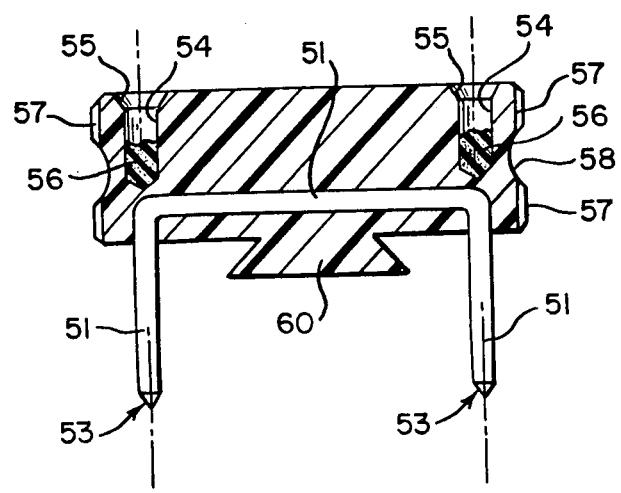
FIG. 13B is a side elevational view, in cross-section, taken along line 13B—13B of FIG. 13A.

FIGS. 13A and 13B illustrate a DIP-shunt according to the present invention which comprises an electrically conductive jumper 51 rigidly molded into a rectangular DIP-shunt housing block or body 52. Jumper 51 is made from a suitably conductive material such as beryllium-copper wire or strip. Terminals 53 of jumper 51 are spaced apart, e.g., according to the aforementioned industrial standard and are tapered at the ends to facilitate insertion thereof into a DIP-socket or into a second shunt as described hereinbelow. Body 52 is made from a suitable insulating molding material, e.g., a thermoset plastic, such as is used in molding small electrical/electronic components. As shown in FIGS. 13A and 13B, two holes 54 with lead-chambers 55 are provided in the top portion of the DIP-shunt, and are spaced apart so as to be mateable with the pair of terminals 53 of a second DIP-shunt. As shown in FIG. 13B, the two holes 54 are each partially filled with a resilient cushion material 5b such as silicone-rubber which performs the same function as described hereinabove in connection with the DIP-switches of the invention. As in the case of the aforementioned switches, the "piggy-back" stacking of the DIP-shunt is also desirable for packing and/or shipping purposes. For example, stacks of 10 or 20 shunts can be contained in a suitable container or cartridge, thus facilitating counting, inventory record keeping, etc.

As shown in FIG. 13A, the DIP-shunts of the invention feature a longitudinal or vertical slot 57 at each end which is designed to serve as a guide when used in the DIP-shunt dispenser cartridge or when the DIP-shunts are automatically inserted in printed circuit boards by means of automated machinery. The DIP-shunts also contain two curved horizontal notches 58 at each end to facilitate extraction of the DIP-shunt from the DIP-socket and to act as detents for the spring-loaded balls mounted in the dispenser-cartridge discussed hereinbelow.

As shown in FIG. 13B, the DIP-shunt therein depicted is a "live" shunt in that the terminals 53 are electrically connected. It is another feature of the invention that the DIP-shunt can be of the "dummy" type wherein terminals 53 are not connected. Alternatively, terminals 53 can be connected by any one or a combination of other desired electrical components interposed along jumper 51 within body 52, for instance, a resistor, capacitor, or light indicating device such as a LED, whereupon the shunt would be a DIP-shunt resistor, DIP-shunt capacitor, DIP-shunt detector, and the like.

Figure 14A:
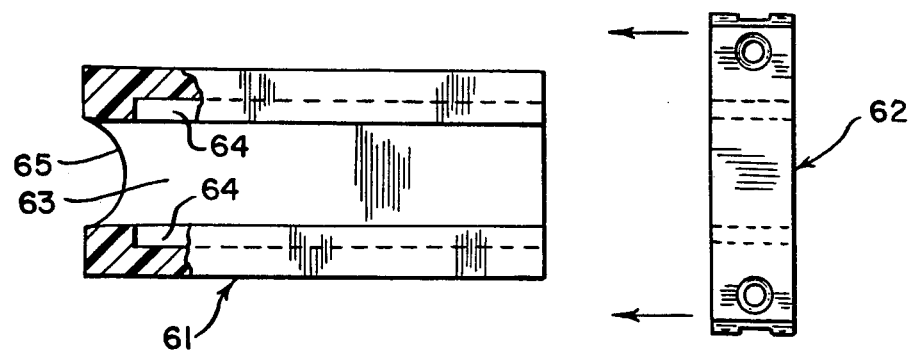
FIG. 14A is a top plan view of a mounting bar and a shunt modulein alignment therewith for loading according to the invention.
Figure 14B:
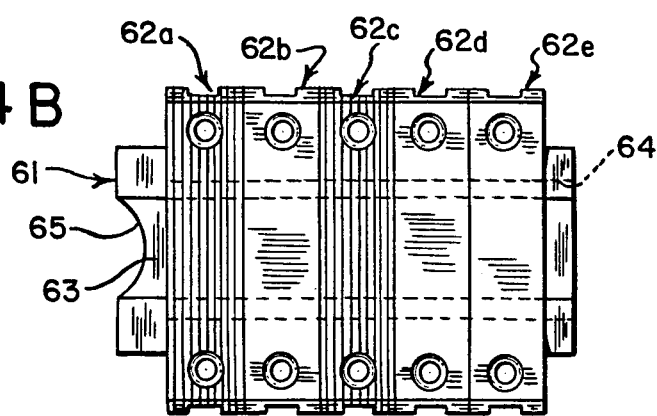
FIG. 14B is a top plan view of a bank of shunt modules loaded on a mounting bar according to the invention.
Figure 14C:
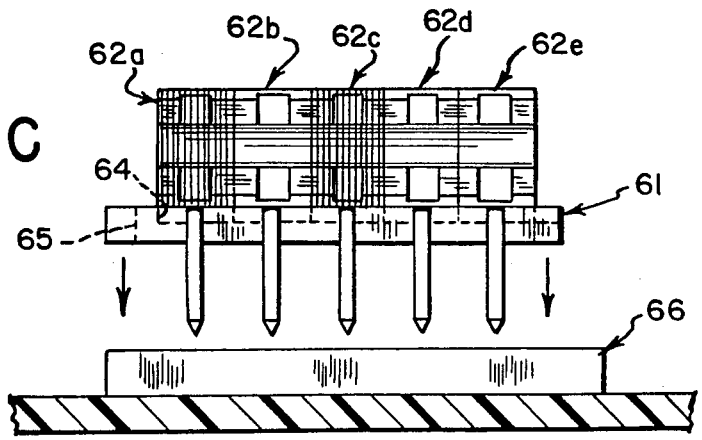
FIG. 14C is a side elevational view of a bank of shunt modules loaded on a mounting bar and aligned with a corresponding socket unit.

Body 52 of the DIP-shunt illustrated in FIGS. 13A and 13B has a dove-tail shaped portion 60 extending along its base which is designed for engagement with a mounting bar 61 in the manner depicted in FIGS. 14A and 14B. Thus, mounting bar 61, which is conveniently made of plastic, is shaped to accept the DIP-shunt 62 for loading (see FIG. 14B) by sliding the DIP-shunt onto the mounting bar having a groove 63 shaped to match the profile of the aforesaid dove-tail 60 in a close-fitting manner. The dove-tail groove 63 on the mounting bar 61 and dove-tail shaped portion 60 of the DIP-shunt body 52 are dimensionally so designed as to provide a slight pressure fit to cause sufficient friction to allow the sliding of the DIP-shunt onto the bar using a moderate amount of force. Mounting bar 61 is desirably closed at one end 64 to act as a stop for the first of the DIP-shunts 62 as shown in FIG. 14B. A semicircular or "polarizing" notch 65 at the closed end of mounting bar 61 serves to orient the assembled modular bank of DIP-shunts (see FIG. 14B) in one way only when the bank is inserted en masse (see FIG. 14C) into a DIP-socket arrangement 66, which also contains a polarizing notch (not shown). This prevents the bank of shunts from being incorrectly installed in the DIP-socket receptacle. As shown in FIGS. 14B and 14C, a plurality of DIP-shunts 62a, 62b, 62B, 62d and 62e having the same or different electrical characteristics (e.g., live vs. dummy shunts) and the corresponding same or different colors, can be installed in a predetermined fashion on the mounting bar 61 whereupon the resulting "bank" of DIP-shunts can be plugged as a modular unit into a DIP-socket receptable 66 to achieve a programmed circuit installation.

SIXTH EMBODIMENT

Figure 15:
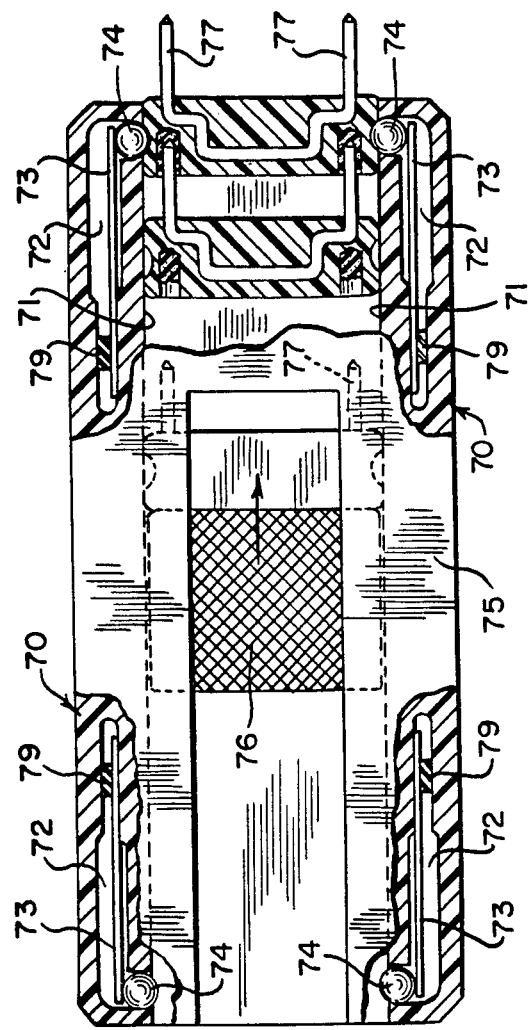
FIG. 15 is a top plan view, in partial cross-section, of a sixth embodiment which is a cartridge-dispenser according to the invention.

FIG. 15 illustrates the dispenser-cartridge of the present invention comprising a flat, elongated housing 70 which has a longitudinal recess 71 the full length thereof. Housing 70 has, at each end, a pair of elongated cavities 72 on either side of recess 71. Each cavity 72 contains a tension spring 73 and a ball or roller 74 at the outer, open end of the cavity. The ball or roller 74 is in communication with recess 71 but is held resiliently captive within cavity 72 due to the constricted opening of the cavity and the pressure exerted on the ball or roller by spring 73. Tension spring 73 is kept in place by plug 79 which is disposed between the spring and the outer wall of cavity 72. Housing 70 additionally has a cover 75 which is conveniently fastened to the housing, e.g., by rivets, screws, adhesive, or by otherwise bonding or fusing the edges to the housing. A slidable button 76, essentially rectangular in shape, is disposed between the housing 70 and cover 75 so as to be held slidably captive therebetween. In order to permit clipping the dispenser-cartridge to, for example, a shirt pocket, a spring clip (not shown) can be appropriately affixed at one end of the back side of the housing, much like the clip of a pen.

The housing 70, cover 75, and slidable button 76 can be made or metal, e.g., aluminum. However, because of cost consideration, a moldable plastic material is preferable. The four balls or rollers 74 which serve as detents to hold and grip the DIP-shunt contained in recess 71 of housing 70 are advantageously made from a relatively hard material, preferably metal, e.g., ball bearings, to minimize wear during prolonged service. Tension spring 73 can be incorporated into recess 71 as a separate component, e.g., a metal leaf spring. On the other hand, modern fabricating techniques and materials permit making the tension spring 73 an integral part of the housing 70, particularly in the case where the latter is itself molded from plastic.

The surface of slidable button 76 and the back surface of housing 70 (not shown) are desirably given a rough-textured finish, e.g., a diamond criss-cross pattern as shown in FIG. 15, to facilitate the operator's grip on the cartridge-dispenser.

Figure 16:
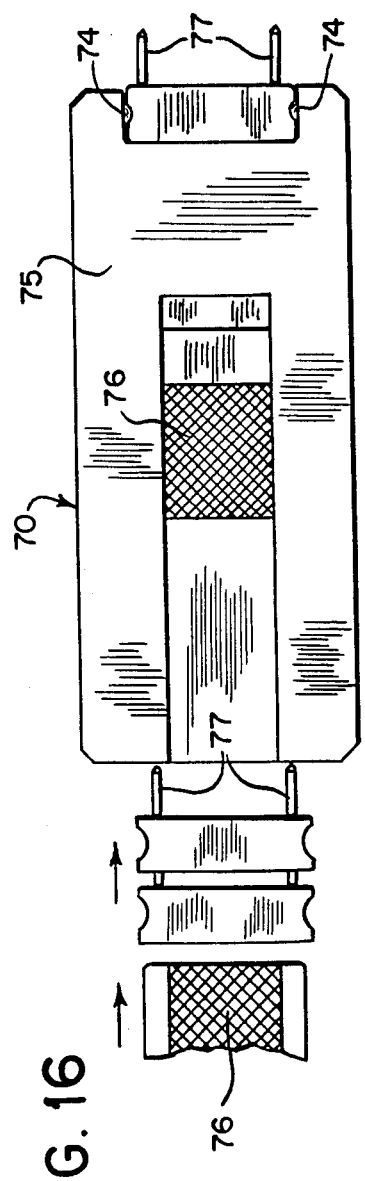
FIG. 16 is a plan view of the cartridge-dispenser of FIG. 15 shown being loaded with shunt modules.

To load the cartridge-dispenser with DIP-switches and/or DIP-shunts, the slidable button 76 is first removed by sliding it out of the rear end of housing 70, past the spring-loaded balls or rollers 74. The shunts and/or switches are then inserted into the opening in that end of the housing as shown in FIG. 16. The spring-loaded balls or rollers 74 yield to the passage of the inserted shunts or switches, the first of which will come to rest against the spring-loaded balls or rollers at the opposite, front end of the cartridge-dispenser. The slidable button 76 is the reinserted as shown in FIG. 16 and pushed in until it rests on the first of the switches or shunts contained in housing 70. A further push on the button 76 will cause the first shunt or switch to finally engage itself between the two spring-loaded balls or rollers at the front end of the cartridge-dispenser with the shunt or metal terminals 77 protruding beyond the working end of the dispenser.

FIG. 17 shows how, by holding the dispenser in an essentially vertical position, the pair of switch or shunt terminals 77 are inserted into the proper pair of DIP-sockets. By keeping button 76 pressed firmly downward and lifting the dispenser-cartridge in an upward movement, the shunt or switch will become disengaged from the captivating, spring-loaded balls or rollers while at the same time remain fully engaged in the DIP-socket.

FIG. 18 shows how to extract or remove a shunt or switch by placing the working end of the cartridge-dispenser across the item to be extracted until the latter engages the dispenser opening, and then pressing down while allowing the slidable button 76 to move upwardly as the switch or shunt is accommodated within the opening 71 in housing 70 (see FIG. 15). The switch or shunt will then move upward into the housing 70 until it is captivated between spring-loaded balls or rollers 74. The resulting retaining force enables the operator to pull the switch or shunt out of the DIP-socket. A further push downward of the cartridge-dispenser on a flat surface will cause the exracted switch or shunt to retract back into housing 70 past the spring-loaded balls or rollers 74. To facilitate movement of switches or shunts along the longitudinal opening 71 in housing 70 the opening can be provided with parallel ridges, e.g., along the side edges, which coact with the above-described vertical grooves on the end surfaces of the switches or shunts to stabilize their alignment within the housing.

As can be seen from FIG. 15, the foregoing loading and extracting operations can be performed sequentially on opposite ends of the cartridge-dispenser so as to load the cartridge in such a way as to give it "bi-directional" capability wherein the cartridge-dispenser can dispense one particular type of DIP-component from one end and the same or another type from the opposite end.

The foregoing description is presented for the purpose of illustrating the invention and its utility and advantages without intending to limit same in any way to specific features or embodiments. It is understood that changes and variations can be made in the foregoing without departing from the scope thereof as defined in the following claims.

Having thus described my invention, what I claim as new and desire to secure by Letters Patent is:

1. An electrical shunt comprising:
   an electrically insulating, substantially rectangular housing block including a base, a top, and two end walls; and
   a pair of elongated, electrically conducting terminals secured to and extending outwardly from the base of the housing block in substantially mutually parallel spaced relationship;
said shunt being further characterized in that:
   the housing has a dove-tail shaped portion extending from the outer surface of the base wall between the electrically conducting terminals and adapted for loading the shunt onto a mounting bar having a groove correspondingly shaped to receive said dove-tail shaped portion;
   the outer surface of the two end walls each has a horizontal groove and a vertical groove for respectively loading the shunt onto and dispensing the shunt from a dispenser cartridge; and
   the top surface of the housing has a pair of spaced-apart recesses partially filled with an adhesively resilient cushion material, said recesses being located in alignment with the axes of the electrically conducting terminals extending outwardly from the base of the housing block and adapted to receive and retain the terminals of a second shunt with sufficient adhesion to allow stacking of a plurality of electrical shunts.

2. An electrical shunt according to claim 1 further including means electrically connecting the terminals together within the housing block.

3. An electrical shunt according to claim 1 wherein the housing block electrically separates the terminals from each other.

4. An electrical shunt according to claim 2 wherein the means electrically connecting the terminals together includes a resistor, capacitor or light indicating device within the housing block.

5. A cartridge-dispenser for loading electrical shunts according to claim 1 and installing and extracting said shunts from integrated circuits, said cartridge-dispenser comprising:
a substantially flat elongated housing defining
a longitudinal recess extending the full length of said housing to slidably receive and house a stack of shunts, and
an elongated cavity disposed adjacent the longitudinal recess;
ball means supported by the housing at an end of the elongated cavity and extending into the longitudinal recess;
spring means supported by the housing within the elongated cavity and urging the ball means into engagement with the stack of shunts located within the longitudinal recess to inhibit movement of the electrical shunts past said ball means;
a cover fastened to the surface of the elongated housing and having an elongated aperture therein substantially narrower than the elongated recess in the housing and extending for at least a portion of the length of the elongated housing; and
a button movably supported between the housing and the cover and extending into the elongated recess for engaging the stack of shunts located therein to move said shunts past said ball means and to dispense the shunts from the longitudinal recess.

* * * * *